United States Patent [19]

Egy

[11] Patent Number: 5,918,241

[45] Date of Patent: Jun. 29, 1999

[54] METHOD AND APPARATUS FOR SETTING A PLURALITY OF ADDRESSES

[75] Inventor: Ronald L. Egy, Wichita, Kans.

[73] Assignee: LSI Logic Corporation, Milpitas, Calif.

[21] Appl. No.: 08/804,326

[22] Filed: Feb. 21, 1997

[51] Int. Cl.⁶ .................................................. G06F 12/02
[52] U.S. Cl. .............................................. 711/4; 395/828
[58] Field of Search ............................... 711/4, 202, 211; 395/284, 823, 828, 829

[56] References Cited

U.S. PATENT DOCUMENTS

| | | | |
|---|---|---|---|
| 3,949,378 | 4/1976 | Crabb et al. | 711/220 |
| 5,253,350 | 10/1993 | Foster et al. | 711/202 |
| 5,274,767 | 12/1993 | Maskovyak | 395/836 |
| 5,325,497 | 6/1994 | Jaffe et al. | 711/114 |
| 5,327,550 | 7/1994 | Pribnow | 395/183.15 |
| 5,437,019 | 7/1995 | Brockmann | 711/5 |
| 5,535,035 | 7/1996 | DeFoster et al. | 359/161 |
| 5,564,059 | 10/1996 | Maskovyak et al. | 707/6 |
| 5,613,158 | 3/1997 | Savage | 395/829 |

*Primary Examiner*—Eddie P. Chan
*Assistant Examiner*—Kevin L. Ellis
*Attorney, Agent, or Firm*—Wayne P. Bailey; Paul J. Maginot

[57] ABSTRACT

A method of setting a plurality of addresses is disclosed. The method includes the step of setting a first module identifier for a first device module. The method further includes the step of setting a first address for a first device, said first address comprising an upper section and a lower section. The method also includes the step of setting a second address for a second device, said second address comprising an upper section and a lower section, wherein the step of setting the first address for the first device includes the steps of setting the upper section of the first address to the first module identifier, and setting the lower section of the first address to a first value; and wherein the step of setting the second address for the second device includes the steps of setting the upper section of the second address to a second value, and setting the lower section of the second address to the first module identifier. An apparatus which sets addresses of each device in a device module is also disclosed.

22 Claims, 3 Drawing Sheets

ADDRESS MAP

| DEVICE | Decimal Address | Binary Address | DEVICE | Decimal Address | Binary Address |
|---|---|---|---|---|---|
| Module 0 Device 0 | 0 | 0000 000 | Module 8 Device 0 | 64 | 1000 000 |
| Module 0 Device 1 | 1 | 0000 001 | Module 8 Device 1 | 65 | 1000 001 |
| Module 0 Device 2 | 2 | 0000 010 | Module 8 Device 2 | 66 | 1000 010 |
| Module 0 Device 3 | 3 | 0000 011 | Module 8 Device 3 | 67 | 1000 011 |
| Module 0 Device 4 | 4 | 0000 100 | Module 8 Device 4 | 68 | 1000 100 |
| Module 0 Device 5 | 5 | 0000 101 | Module 8 Device 5 | 69 | 1000 101 |
| Module 0 Device 6 | 6 | 0000 110 | Module 8 Device 6 | 70 | 1000 110 |
| Module 0 Device 7 | 7 | 0000 111 | Module 8 Device 7 | 71 | 1000 111 |
| Module 1 Device 0 | 8 | 0001 000 | Module 9 Device 0 | 72 | 1001 000 |
| Module 1 Device 1 | 9 | 0001 001 | Module 9 Device 1 | 73 | 1001 001 |
| Module 1 Device 2 | 10 | 0001 010 | Module 9 Device 2 | 74 | 1001 010 |
| Module 1 Device 3 | 11 | 0001 011 | Module 9 Device 3 | 75 | 1001 011 |
| Module 1 Device 4 | 12 | 0001 100 | Module 9 Device 4 | 76 | 1001 100 |
| Module 1 Device 5 | 13 | 0001 101 | Module 9 Device 5 | 77 | 1001 101 |
| Module 1 Device 6 | 14 | 0001 110 | Module 9 Device 6 | 78 | 1001 110 |
| Module 1 Device 7 | 15 | 0001 111 | Module 9 Device 7 | 79 | 1001 111 |
| Module 2 Device 0 | 16 | 0010 000 | Module 0 Device 8 | 80 | 101 0000 |
| Module 2 Device 1 | 17 | 0010 001 | Module 1 Device 8 | 81 | 101 0001 |
| Module 2 Device 2 | 18 | 0010 010 | Module 2 Device 8 | 82 | 101 0010 |
| Module 2 Device 3 | 19 | 0010 011 | Module 3 Device 8 | 83 | 101 0011 |
| Module 2 Device 4 | 20 | 0010 100 | Module 4 Device 8 | 84 | 101 0100 |
| Module 2 Device 5 | 21 | 0010 101 | Module 5 Device 8 | 85 | 101 0101 |
| Module 2 Device 6 | 22 | 0010 110 | Module 6 Device 8 | 86 | 101 0110 |
| Module 2 Device 7 | 23 | 0010 111 | Module 7 Device 8 | 87 | 101 0111 |
| Module 3 Device 0 | 24 | 0011 000 | Module 8 Device 8 | 88 | 101 0000 |
| Module 3 Device 1 | 25 | 0011 001 | Module 9 Device 8 | 89 | 101 0001 |
| Module 3 Device 2 | 26 | 0011 010 |  | 90 | 1011 010 |
| Module 3 Device 3 | 27 | 0011 011 |  | 91 | 1011 011 |
| Module 3 Device 4 | 28 | 0011 100 |  | 92 | 1011 100 |
| Module 3 Device 5 | 29 | 0011 101 |  | 93 | 1011 101 |
| Module 3 Device 6 | 30 | 0011 110 |  | 94 | 1011 110 |
| Module 3 Device 7 | 31 | 0011 111 |  | 95 | 1011 111 |
| Module 4 Device 0 | 32 | 0100 000 | Module 0 Device 9 | 96 | 110 0000 |
| Module 4 Device 1 | 33 | 0100 001 | Module 1 Device 9 | 97 | 110 0001 |
| Module 4 Device 2 | 34 | 0100 010 | Module 2 Device 9 | 98 | 110 0010 |
| Module 4 Device 3 | 35 | 0100 011 | Module 3 Device 9 | 99 | 110 0011 |
| Module 4 Device 4 | 36 | 0100 100 | Module 4 Device 9 | 100 | 110 0100 |
| Module 4 Device 5 | 37 | 0100 101 | Module 5 Device 9 | 101 | 110 0101 |
| Module 4 Device 6 | 38 | 0100 110 | Module 6 Device 9 | 102 | 110 0110 |
| Module 4 Device 7 | 39 | 0100 111 | Module 7 Device 9 | 103 | 110 0111 |
| Module 5 Device 0 | 40 | 0101 000 | Module 8 Device 9 | 104 | 110 0000 |
| Module 5 Device 1 | 41 | 0101 001 | Module 9 Device 9 | 105 | 110 0001 |
| Module 5 Device 2 | 42 | 0101 010 |  | 106 | 1101 010 |
| Module 5 Device 3 | 43 | 0101 011 |  | 107 | 1101 011 |
| Module 5 Device 4 | 44 | 0101 100 |  | 108 | 1101 100 |
| Module 5 Device 5 | 45 | 0101 101 |  | 109 | 1101 101 |
| Module 5 Device 6 | 46 | 0101 110 |  | 110 | 1101 110 |
| Module 5 Device 7 | 47 | 0101 111 |  | 111 | 1101 111 |
| Module 6 Device 0 | 48 | 0110 000 |  | 112 | 1110 000 |
| Module 6 Device 1 | 49 | 0110 001 |  | 113 | 1110 001 |
| Module 6 Device 2 | 50 | 0110 010 |  | 114 | 1110 010 |
| Module 6 Device 3 | 51 | 0110 011 |  | 115 | 1110 011 |
| Module 6 Device 4 | 52 | 0110 100 |  | 116 | 1110 100 |
| Module 6 Device 5 | 53 | 0110 101 |  | 117 | 1110 101 |
| Module 6 Device 6 | 54 | 0110 110 |  | 118 | 1110 110 |
| Module 6 Device 7 | 55 | 0110 111 |  | 119 | 1110 111 |
| Module 7 Device 0 | 56 | 0111 000 | Controller 1 | 120 | 1111 000 |
| Module 7 Device 1 | 57 | 0111 001 | Controller 2 | 121 | 1111 001 |
| Module 7 Device 2 | 58 | 0111 010 | Controller 3 | 122 | 1111 010 |
| Module 7 Device 3 | 59 | 0111 011 | Controller 4 | 123 | 1111 011 |
| Module 7 Device 4 | 60 | 0111 100 |  | 124 | 1111 100 |
| Module 7 Device 5 | 61 | 0111 101 |  | 125 | 1111 101 |
| Module 7 Device 6 | 62 | 0111 110 |  | 126 | 1111 110 |
| Module 7 Device 7 | 63 | 0111 111 | not used | 127 | 1111 111 |

*FIG. 3*

METHOD AND APPARATUS FOR SETTING A PLURALITY OF ADDRESSES

BACKGROUND OF THE INVENTION

The present invention relates generally to a device addressing scheme, and more particularly to a method and apparatus for setting an address for each device of a device module.

The Fibre Channel Arbitrated Loop topology is defined in ANSI (American Standards Institute, Inc.) X3.230-1994, *Fibre Channel—Physical and Signaling Interface* (FC-PH), and ANSI X3.272-199 x, *Fibre Channel—Arbitrated Loop* (FC-AL-2), Rev. 5.2 which are both hereby incorporated by reference. The Fibre Channel Arbitrated Loop topology provides a general transport for upper level protocols such as the Intelligent Peripheral Interface (IPI), and the Small Computer System Interface (SCSI) command sets. The SCSI command set in particular has been commonly used with storage devices and storage modules having several drives. Furthermore, storage modules having 10 drives have become preferred by customers that utilize the SCSI command set in non-Fibre Channel environments.

There are basically two factors that have resulted in the customer preference for storage modules that contain 10 drives. One factor that has influenced customer preference for storage modules containing 10 drives is the fact that the standard 19 inch rack that is used to hold these drives is only wide enough to hold 10 standard drives. Manufactures have not increased the width of the rack for basically two reasons. Firstly, since standard 19 inch racks are easily obtainable, manufacturing costs are lower by using the standard size rack. Secondly, customers have grown accustomed to storage modules having a width of about 19 inches and would likely resist the change to a wider width.

Another factor for this customer preference for drive modules containing 10 drives is that the more drives that are in one storage module the lower the per drive cost of the storage module. This lower per drive cost results from the relatively fixed costs of the storage module (e.g. back plane, fan, power supply) being spread across more drives. Therefore, in order to reduce the per drive cost of the storage module, the storage module should contain as many drives as will fit in the storage module enclosure. As eluded to above, currently only up to 10 Fibre Channel Arbitrated Loop (FC-AL) drives will fit in a 19 inch rack. Therefore, due to customer preference for 19 inch racks and lower per disk cost of the storage module, a storage module utilizing a 19 inch rack and 10 drives has some market advantage.

Customers also prefer to have the option of upgrading their storage systems to provide for more storage capacity as their demand for storage capacity increases. One way to address this customer preference is to design a storage system to which additional storage modules may be easily added. However, in most storage systems, each drive of the storage system must have a separate address that is different than all other addresses of the storage system. This requirement of separate addresses for each drive can result in a problem when setting addresses of a newly added storage module if a scheme for assigning addresses to each drive of a storage module has not been set.

For example, if a storage system currently contains one storage module having 10 drives and there is no preset scheme for setting the addresses of the drives, then it may be very difficult for the customer to add another storage module to the storage system. This difficulty results because the customer has no simple way of assuring that the addresses of the drives of the newly added storage module will not conflict with the addresses of the already existing storage module of the storage system.

One way this problem has been addressed is to assign a module identifier to each storage module and to use the module identifier as part of the address for each drive of the storage module. For example, in a Fibre Channel Arbitrated Loop environment where each address is limited to only seven (7) bits, a different three bit module identifier could be assigned to each storage module and that same three bit module identifier could set the three most significant bits of the address of each drive of that storage module. Therefore, the three bit module identifier could be used to identify in which storage module a drive is located, and the remaining four bits of each drive's address could be used to identify the specific drive of the storage module.

Assuming the manufacturer has set the four least significant bits of each drive to a different value, this scheme makes it relatively easy for the customer to assure that no address conflicts will occur as a result of adding a storage module to the storage system. Under this scenario, all the customer needs to do is to set the three bit module identifier of the new storage module to a value that is different than the module identifiers of the already existing storage modules of the storage system. By doing so, the customer will assure that no drive of the storage system will have the same address as another drive of the storage system.

While this solution is quite simple to implement, it limits the storage system to a total of at most 80 drives. This limitation is a result of utilizing only three bits for the module identifier of each storage module and limiting each storage module to 10 drives. Because the module identifier is limited to three bits, only $2^3$ or 8 values may be represented by the module identifier. Therefore, since each storage module of the storage system needs its own unique module identifier, only 8 storage modules may exist in any one storage system. Furthermore, as stated above, since each storage module contains up to 10 drives, the storage system is limited to 8 storage modules of 10 drives each, or 80 drives total.

However this solution fails to efficiently utilize the available address space. In other words, the above solution utilizes only 80 of the 127 available addresses on a single fibre channel arbitrated loop, and as a result unnecessarily limits the number of drives the storage system may include. What is needed, therefore, is a method and apparatus which sets addresses for each drive of a storage module such that each storage module may contain 10 drives, additional storage modules may be easily added to an existing storage system, and the address space may be better utilized so that more drives may exist in a single storage system.

SUMMARY OF THE INVENTION

In accordance with one embodiment of the present invention, there is provided a method of setting a plurality of addresses. The method includes the step of setting a first module identifier for a first device module. The method further includes the step of setting a first address for a first device, said first address comprising an upper section and a lower section. The method also includes the step of setting a second address for a second device, said second address comprising an upper section and a lower section, wherein the step of setting the first address for the first device includes the steps of setting the upper section of the first address to the first module identifier, and setting the lower section of the first address to a first value; and wherein the step of setting the second address for the second device includes the steps of setting the upper section of the second address to a second value, and setting the lower section of the second address to the first module identifier.

Pursuant to another embodiment of the present invention, there is provided a device module. The device module includes a first module connector, a module designator, a first device slot, and a second device slot. The module designator is configured to set a module identifier. The first device slot is configured to receive a first device, to operatively couple the first device to the first module connector, and to set a first address for the first device. The first address includes an upper section set to the module identifier and a lower section set to a first value. The second device slot is configured to receive a second device, to operatively couple the second device to the first module connector, and to set a second address for the second device. The second address includes an upper section set to a second value and a lower section set to the module identifier.

Pursuant to yet another embodiment of the present invention, there is provided a file server. The file server includes a computer and a first device module operatively coupled to the computer via a first module connector. The first device module includes a first module designator, a first device slot, and a second device slot. The first module designator is configured to set a first module identifier. The first device slot is configured to receive a first device, to operatively couple the first device to the first module connector, and to set a first address for the first device. The first address includes an upper section set to the first module identifier and a lower section set to a first value. The second device slot is configured to receive a second device, to operatively couple the second device to the first module connector, and to set a second address for the second device. The second address includes an upper section set to a second value and a lower section set to the first module identifier.

It is therefore an object of the present invention to provide a new and useful method and apparatus for setting addresses for each device of a device module.

It is another object of the present invention to provide a method and apparatus for setting addresses for each device of a device module such that additional device modules may be easily added to an existing system.

It is yet another object of the present invention to provide a method and apparatus for setting addresses for each device of a device module such that 10 device modules each containing 10 devices may be uniquely addressed with 7 bits.

The above and other objects, features, and advantages of the present invention will become apparent from the following description and the attached drawings.

BRIEF DESCRIPTION OF THE DRAWINGS

FIG. 3 is a table depicting an addressing scheme for setting a separate seven bit address for each device slot of a system that may include up to 10 device modules each including up to 10 device slots in a manner consistent with features of the present invention.

DETAILED DESCRIPTION OF THE PREFERRED EMBODIMENT

Figure 1:
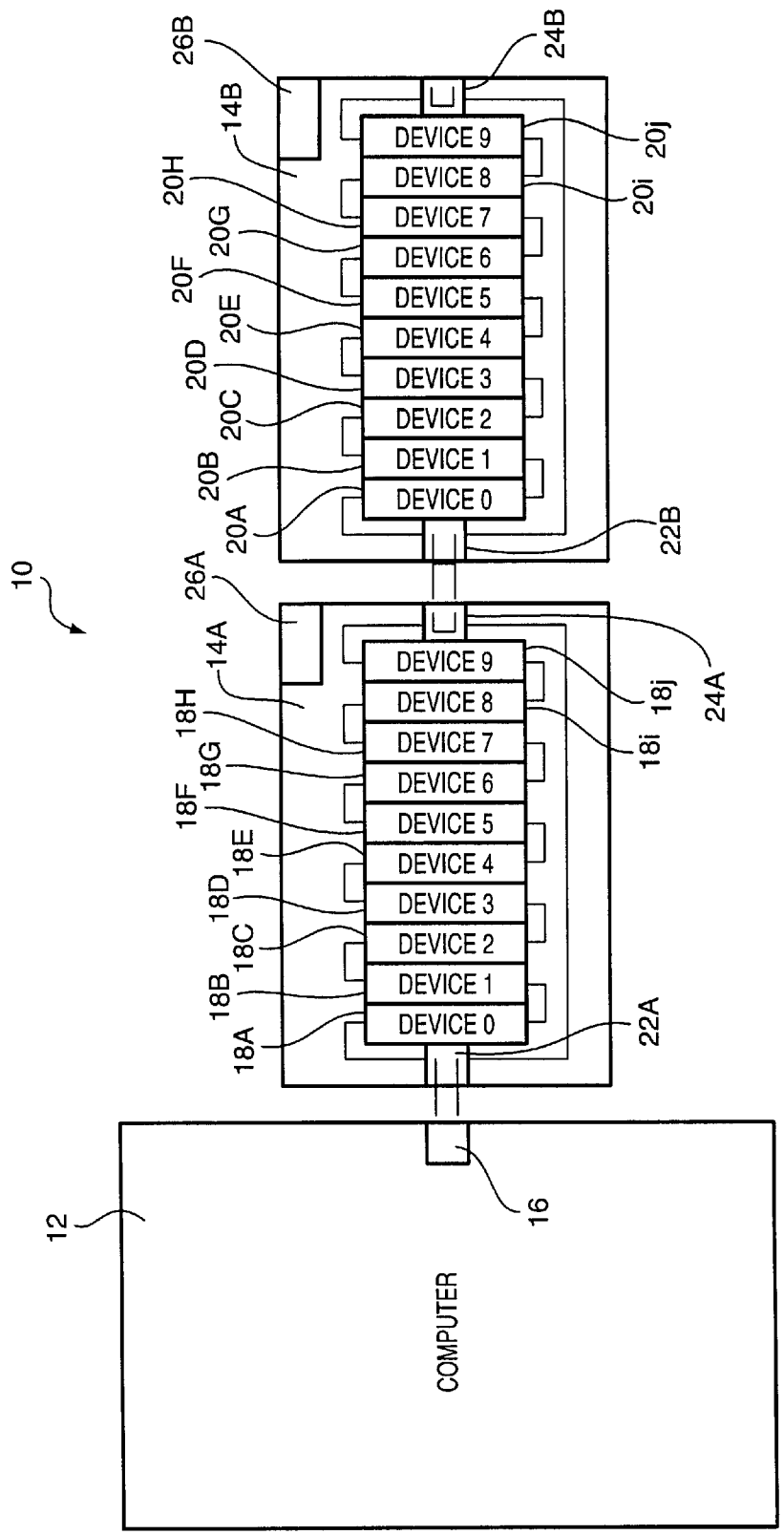
FIG. 1 is a simplified block diagram of a file server which incorporates features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIG. 1, there is shown a simplified block diagram of a file server 10 which incorporates features of the present invention therein. The file server 10 includes a computer 12, a first device module 14a, and a second device module 14b. The computer 12 may be any conventional data processing system which includes hardware and software for controlling input-output devices. In particular, the preferred computer 12 as shown in FIG. 1 includes a controller 16 that sends and receives data to and from devices coupled to a fibre channel arbitrated loop of which the controller 16 is a member.

The first device module 14a includes ten device slots 18a–18j that are each configured to receive a separate device. Likewise the second device module 14b includes ten device slots 20a–20j that are each configured to receive a separate device. While the device slots 18a–18j may be configured to receive most any type of peripheral device, the present invention has significant utility for RAID (redundant array of inexpensive disk) storage systems that utilize a fibre channel arbitrated loop topology. As a result, in the preferred embodiment the device slots 18a–18j and 20a–20j are configured to receive disk drives and preferably in a hot-swappable manner.

Furthermore, first device module 14a includes a first module connector 22a and a first expansion connector 24a. The first module connector 22a provides an interface for operatively coupling the first device module 14a to the controller 16 of the computer 12. The first expansion connector 24a provides an interface for operatively coupling additional device modules such as the second device module 14b to the controller 16.

Likewise, the second device module 14b includes a second module connector 22b and a second expansion connector 24b. The second module connector 22b provides an interface for operatively coupling the second device module 14b to the controller 16 of the computer 12. The second expansion connector 24b provides an interface for operatively coupling additional device modules to the controller 16. As shown in FIG. 1, the second module connector 22b actually couples the second module 14b to the controller 16 of computer 12 by connecting the second module connector 22b to the expansion connector 24a with the appropriate cables thereby extending the fibre channel arbitrated loop of the file server 10 to include the computer 12, the first device module 14a, and the second device module 14b.

As can be seen from FIG. 1, the device slots 18a–18j, device slots 20a–20j, and the controller 16 are connected in a loop configuration. In particular, controller 16 is connected to device slot 18a via appropriate cables and first module connector 22a. Device slot 18a is connected to device slot 18b. Device slot 18b is connected to device slot 18c. Device slots 18c–18j are likewise connected in order, one to another. Device slot 18j is then connected to expansion connector 24a which either closes the loop by connecting device slot 18j to the controller 16 via first module connector 22a or expands the loop by connecting device slot 18j to device slot 20a via the second module connector 22b.

The expansion connector 24a preferably contains circuitry to automatically detect the presence of the second device module 14b connected to the expansion connector 24a, and upon the status of this connection to automatically make the appropriate connection for device slot 18j. However, the first device module 14a could alternatively contain a switch, a jumper, a programmable register, or other status mechanism for informing the expansion connector 24a to either close or expand the loop.

Device slots 20a–20j are likewise connected in order, one to another. And like device slot 18j of the first module 14a, device slot 20j is connected to expansion slot 24b which either closes the loop by connecting device slot 20j to the controller 16 via second module connector 22b and the first module connector 22a or expands the loop by connecting device slot 20j to a device slot of yet another device module.

The expansion connector 24b also preferably contains circuitry to automatically detect the presence of another device module connected to the expansion connector 24b, and upon the status of this connection to automatically make the appropriate connection for device slot 20j. However, the second device module 14b could alternatively contain a switch, a jumper, a programmable register, or other status mechanism for informing the expansion connector 24b to either close or expand the loop.

The first device module 14a also includes a first module designator 26a. The first module designator 26a sets a first module identifier for the first module 14a. The first module designator 26a is preferably a switching mechanism capable of generating a first module identifier that is of a first word length. For example, in the embodiment being described, the first module designator 26a must generate a first module identifier for the first device module 14a that has a four bit word length. Examples of a suitable first module designator 26a include a rotary switch, jumpers, DIP switches, and even hardwiring. However, a hardwired first module designator 26a lacks the desired flexibility when adding additional device modules to an already existing system.

The second device module 14b also includes a second module designator 26b. The second module designator 26b sets a second module identifier for the second module 14b. The second module designator 26b is preferably a switching mechanism capable of generating a second module identifier that is of the first word length. For example, in the embodiment being described, the second module designator 26b must generate a second module identifier for the second device module 14b that has a four bit word length. Examples of a suitable second module designator 26b include a rotary switch, jumpers, DIP switches, and even hardwiring. However, a hardwired second module designator 26b lacks the desired flexibility when adding additional device modules to an already existing system.

Figure 2:
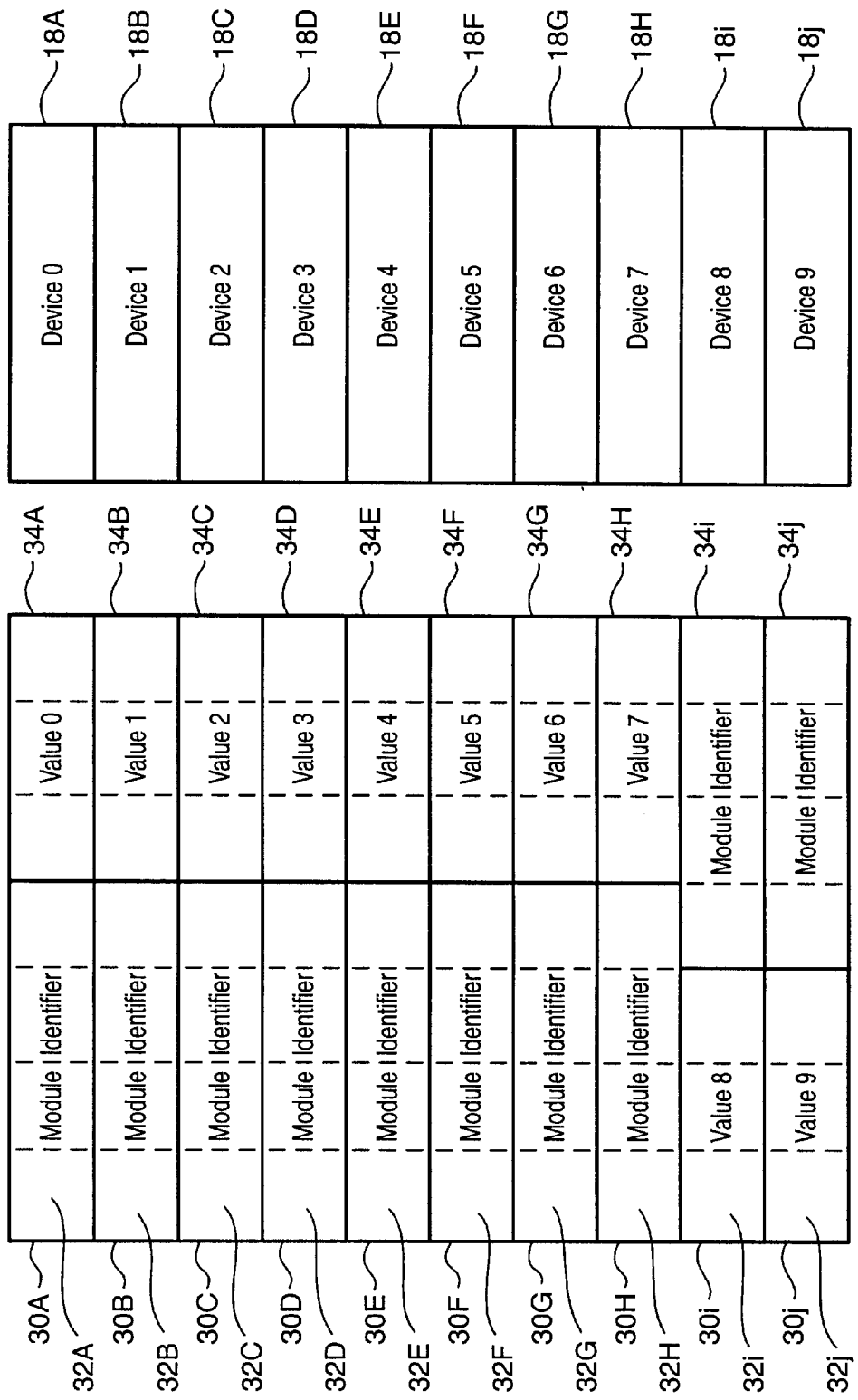
FIG. 2 is a graphical representation depicting one embodiment of setting an address for each device slot of a device module in a manner consistent with features of the present invention.

In FIG. 2 there is shown a graphical representation of one embodiment for setting an address 30a–30j for each device slot 18a–18j of the first device module 14a in a manner that utilizes features of the present invention. Each address 30a–30j corresponds to a device slot 18a–18j and includes an upper section 32a–32j and a lower section 34a–34j. Each upper section 32a–32j consists of a portion of the most significant bits of each address 30a–30j. Whereas, each lower section 34a–34j consists of the remaining least significant bits of each address 30a–30j.

Furthermore, as shown in FIG. 2, the upper sections 32a–32h of the addresses 30a–30h are set by the first module designator 26a of FIG. 1 to a first module identifier. Likewise the lower sections 32i–32j of the addresses 30i–30j are set by the first module designator 26a to the first module identifier.

The lower sections 34a–34h of the addresses 30a–30h are each set to a different value. In the preferred embodiment, these lower sections 34a–34h are hardwired to a appropriate value; however, these lower sections 34a–34h could also by set by switches, jumpers, and/or registers. As a result of setting each lower section 34a–34h to a different value, each address 30a–30h of the first device module will be different. Likewise the upper sections 32i–32j of addresses 30i–30j are each set to a different value. However, the upper sections 32i–32j have the added constraint that the upper sections 32i–32j must be different than the corresponding most significant bits of any device module in use by the system. In the preferred embodiment, these upper sections 32i–32j are hardwired to an appropriate value; however, these upper sections 32i–32j could also by set by switches, jumpers, and/or registers.

These constraints on setting addresses 30a–30j of the first device module 14a should become clear with reference to FIG. 3. FIG. 3 shows a table of a specific example of an address map for an addressing scheme which sets a separate seven bit address for each device slot of a system that may contain up to ten device modules each including up to ten device slots. The addressing scheme disclosed in FIG. 3 is particularly useful in fibre channel arbitrated loop environments because in such an environment each device on the loop needs a unique address and each address may only be 7 bits wide.

Referring now to FIG. 2 and FIG. 3, the portion of the address map containing decimal addresses 0–79 shows one possibility for setting the corresponding addresses 30a–30h of any device module of a system, for up to ten device modules total. For example, this portion shows that the first module designator 26a could set the upper sections 32a–32h to any one of the 4 bit binary values ranging from 0000 to 1001, and set the lower sections 34a–34h to the three bit binary values ranging from 000–111 respectively. Likewise, this portion of the address map shows that the corresponding addresses 30a–30h of any device module will not conflict with another device module as long as each device module uses a different module identifier.

Now referring to the portions of the address map containing decimal addresses 80–89 and decimal addresses 96–105, there is shown one possibility for setting the corresponding addresses 30i–30j of any device module of a system, for up to ten device modules total. For example, this portion of the address map shows that the upper sections 32i–32j of each device module may be set to the three bit binary values 101 and 110, respectively. As can be seen from the address map these three bit binary values are different than the three most significant bits of decimal addresses 0–79 and are therefore different than the three most significant bits of any module identifier utilized by this exemplary addressing scheme.

Furthermore, since each device module of the system utilizes a different module identifier, the lower sections 34i of each device module are different, and therefore the addresses 30i of each device module are also different even though the upper sections 30i of each device module is set to the value 101. Likewise, since each device module of the system utilizes a different module identifier, the lower sections 34j of each device module are different, and therefore the addresses 30j of each device module are also different even though the upper section 30j of each device module is set to the value 110.

Also shown in the address map of FIG. 3 some addresses may simply not be used. For example, decimal address 127 is not used in the fibre channel arbitrate loop topology. Furthermore, as also shown in the address map the controller 16 of the file server 10 also needs an address. For example, decimal addresses 120–123 provide for four controller addresses which anyone may be used for the controller 16. It should be noted that even under the fibre channel specification there is nothing special about the location of these four controller addresses. The only real requirement is that the controller addresses be located such that they do not conflict with the device slot addresses.

It should be noted that the exemplary addressing scheme shown in FIG. 3 only utilizes module identifiers ranging from four bit binary value 0000 to 1001. As a result, the module designators of the system such as the first module designator 26a should only generate binary values in this range for this particular scheme. As can be seen from the address map, under this particular scheme if the first designator 26a were set to 1010, device 0 through device 7 of the first device module 14a would conflict with device 8 for module 0 through module 7.

In addition, it should be noted that two schemes for representing addresses exist in the computer industry. The two addressing schemes are sometimes referred to as big endian and little endian. Under a big endian addressing scheme, the most significant bit of an address is the left most bit of the address and each bit of the address decreases in significance as one moves from the left most bit of the address to the right most bit of the address. Under a little endian addressing scheme, the most significant bit of an address is the right most bit of the address and each bit of the address decreases in significance as one moves from the right most bit of the address to the left most bit of the address. As described, the addressing scheme of the present invention assumed a big endian addressing environment; however, it should be apparent to one skilled in the art that the addressing scheme of the present invention could also be used in a little endian addressing environment.

Furthermore, while the description refers to an upper section and a lower section for each address, the terms upper section and lower section are only used to set a relationship between addresses of different devices and not a relationship between the sections within each address. In other words, the upper section of an address does not necessarily include the most significant bits of the address. Likewise, the lower section of an address does not necessarily include the least significant bits of the address. Instead, the upper section of a first address includes at least one bit that has a significance to the first address that is the same as the significance that a bit of the upper section of a second address has to the second address. Likewise, the lower section of the first address includes at least one bit that has a significance to the first address that is the same as the significance a bit of the lower section of a second address has to the second address.

Furthermore, the upper section and lower section of each address may actually include non-contiguous bits of an address. For example in a seven bit address environment, the upper section of a first address may include the first bit, third bit, fourth bit, and fifth bit of the first address; the lower section of the first address may include the second bit, sixth bit, and seventh bit of the first address; the upper section of a second address may include the first bit, third bit, and fourth bit of the second address; and the lower section of the second address may include the second bit, fifth bit, sixth bit, and the seventh bit of the second address.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. A method of setting a plurality of addresses, comprising the steps of:

setting a first module identifier for a first device module;

setting a first address for a first device, said first address comprising an upper section and a lower section;

setting a second address for a second device, said second address comprising an upper section and a lower section;

wherein the step of setting the first address for the first device includes the steps of setting the upper section of the first address to the first module identifier, and setting the lower section of the first address to a first value; and wherein the step of setting the second address for the second device includes the steps of setting the upper section of the second address to a second value, and setting the lower section of the second address to the first module identifier.

2. The method of claim 1, wherein the step of setting the first module identifier includes the step of configuring a switch of the first device module to generate the first module identifier.

3. The method of claim 1, wherein:

the step of setting the lower section of the first address includes the step of hardwiring the lower section of the first address to the first value; and the step of setting the upper section of the second address includes the step of hardwiring the upper section of the second address to the second value.

4. The method of claim 1, wherein the step of setting the upper section of second address includes the step of:

selecting for the second value, a third value different than the corresponding most significant bits of the first address.

5. The method of claim 1, wherein:

the step of setting the first module identifier includes the step of limiting the first module identifier to a first word length;

the step of assigning the lower section of the first address includes the step of limiting the first value to a second word length that is shorter than the first word length; and the step of assigning the upper section of the second address includes the step of limiting the second value to the second word length.

6. The method of claim 1, further including the steps of:

setting a second module identifier for a second device module, said second module identifier being different than the first module identifier;

setting a third address for a third device, said third address comprising an upper section and a lower section;

setting a fourth address for a fourth device, said fourth address comprising an upper section and a lower section;

wherein the step of setting the third address for the third device includes the steps of setting the upper section of the third address to the second module identifier, and setting the lower section of the third address to a third value; and wherein the step of setting the fourth address for the fourth device includes the steps of setting the upper section of the fourth address to a fourth value, and setting the lower section of the fourth address to the second module identifier.

7. The method of claim 1, further including the steps of:

setting a third address for a third device, said third address comprising an upper section and a lower section;

setting a fourth address for a fourth device, said fourth address comprising an upper section and a lower section;

setting a fifth address for a fifth device, said fifth address comprising an upper section and a lower section;

setting a sixth address for a sixth device, said sixth address comprising an upper section and a lower section;

setting a seventh address for a seventh device, said seventh address comprising an upper section and a lower section;

setting an eighth address for a eighth device, said eighth address comprising an upper section and a lower section;

setting a ninth address for a ninth device, said ninth address comprising an upper section and a lower section;

setting a tenth address for a tenth device, said tenth address comprising an upper section and a lower section;

wherein the step of setting the third address for the third device includes the steps of setting the upper section of the third address to the first module identifier, and setting the lower section of the third address to a third value;

wherein the step of setting the fourth address for the fourth device includes the steps of setting the upper section of the fourth address to the first module identifier, and setting the lower section of the fourth address to a fourth value;

wherein the step of setting the fifth address for the fifth device includes the steps of setting the upper section of the fifth address to the first module identifier, and setting the lower section of the fifth address to a fifth value;

wherein the step of setting the sixth address for the sixth device includes the steps of setting the upper section of the sixth address to the first module identifier, and setting the lower section of the sixth address to a sixth value;

wherein the step of setting the seventh address for the seventh device includes the steps of setting the upper section of the seventh address to the first module identifier, and setting the lower section of the seventh address to a seventh value;

wherein the step of setting the eighth address for the eighth device includes the steps of setting the upper section of the eighth address to the first module identifier, and setting the lower section of the eighth address to a eighth value;

wherein the step of setting the ninth address for the ninth device includes the steps of setting the upper section of the ninth address to the first module identifier, and setting the lower section of the ninth address to a ninth value;

wherein the step of setting the tenth address for the tenth device includes the steps of setting the upper section of the tenth address to a tenth value that is different than the second value, and setting the lower section of the tenth address to the first module identifier, and wherein first value, said third value, said fourth value, said fifth value, said sixth value, said seventh value, said eight value, and said ninth value are all set to different values.

8. The method of claim 7, wherein:

the step of setting the first module identifier includes the step of selecting the first module identifier from a group of unsigned four bit binary values ranging from 0000 to 1001; and the step of setting the lower section of the first address includes the step of selecting a three bit binary value of 000 for the first value;

the step of setting the upper section of the second address includes the step of selecting a three bit binary value of 101 for the second value;

the step of setting the lower section of the third address includes the step of selecting a three bit binary value of 001 for the third value;

the step of setting the lower section of the fourth address includes the step of selecting a three bit binary value of 010 for the fourth value;

the step of setting the lower section of the fifth address includes the step of selecting a three bit binary value of 011 for the fifth value;

the step of setting the lower section of the sixth address includes the step of selecting a three bit binary value of 100 for the sixth value;

the step of setting the lower section of the seventh address includes the step of selecting a three bit binary value of 101 for the seventh value;

the step of setting the lower section of the eighth address includes the step of selecting a three bit binary value of 110 for the eighth value;

the step of setting the lower section of the ninth address includes the step of selecting a three bit binary value of 111 for the ninth value; and the step of setting the upper section of the tenth address includes the step of selecting a three bit binary value of 110 for the tenth value.

9. A device module, comprising;

a module connector;

a module designator configured to set a module identifier;

a first device slot configured to receive a first device, to operatively couple said first device to said module connector, and to set a first address for said first device, said first address comprising an upper section set to said module identifier and a lower section set to a first value;

a second device slot configured to receive a second device, to operatively couple said second device to said module connector, and to set a second address for said second device, said second address comprising an upper section set to a second value and a lower section set to said module identifier.

10. The device module of claim 9, wherein:

said module designator includes a switch.

11. The device module of claim 9, wherein:

said first device slot hardwires said lower section of said first address to said first value; and said second device slot hardwires said upper section of said second address to said second value.

12. The device module of claim 9, wherein:

said second value is different than the corresponding most significant bits of said first address.

13. The device module of claim 9, further comprising:

an expansion connector configured to operatively couple said module connector to a second module connector of a second device module.

14. The device module of claim 9, wherein:

said module identifier possesses a first word length;

said upper section of said first address and said lower section of said second address possesses said first word length; and said lower section of said first address and said upper section of said second address possesses a second word length that is shorter than said first word length.

15. The device module of claim 9, further comprising:

a third device slot configured to receive a third device, to operatively couple said third device to said module connector, and to set a third address for said third device, said third address comprising an upper section set to said module identifier and a lower section set to a third value;

a fourth device slot configured to receive a fourth device, to operatively couple said fourth device to said module connector, and to set a fourth address for said fourth device, said fourth address comprising an upper section set to said module identifier and a lower section set to a fourth value;

a fifth device slot configured to receive a fifth device, to operatively couple said fifth device to said module connector, and to set a fifth address for said fifth device, said fifth address comprising an upper section set to said module identifier and a lower section set to a fifth value;

a sixth device slot configured to receive a sixth device, to operatively couple said sixth device to said module connector, and to set a sixth address for said sixth device, said sixth address comprising an upper section set to said module identifier and a lower section set to a sixth value;

a seventh device slot configured to receive a seventh device, to operatively couple said seventh device to said module connector, and to set a seventh address for said seventh device, said seventh address comprising an upper section set to said module identifier and a lower section set to a seventh value;

a eighth device slot configured to receive a eighth device, to operatively couple said eighth device to said module connector, and to set a eighth address for said eighth device, said eighth address comprising an upper section set to said module identifier and a lower section set to a eighth value;

a ninth device slot configured to receive a ninth device, to operatively couple said ninth device to said module connector, and to set a ninth address for said ninth device, said ninth address comprising an upper section set to said module identifier and a lower section set to a ninth value;

a tenth device slot configured to receive a tenth device, to operatively couple said tenth device to said module connector, and to set a tenth address for said tenth device, said tenth address comprising a lower section set to said module identifier and an upper section set to a tenth value that is different than said second value; and wherein said first value, said third value, said fourth value, said fifth value, said sixth value, said seventh value, said eight value, and said ninth value are all different.

16. The device module of claim 15, wherein:

said module identifier is selected from a group of unsigned four bit binary values ranging from 0000 to 1001;

said first value is a three bit binary value of 000;

said second value is a three bit binary value of 101;

said third value is a three bit binary value of 001;

said fourth value is a three bit binary value of 010;

said fifth value is a three bit binary value of 011;

said sixth value is a three bit binary value of 100;

said seventh value is a three bit binary value of 101;

said eighth value is a three bit binary value of 110;

said ninth value is a three bit binary value of 111; and said tenth value is a three bit binary value of 110.

17. The device module of claim 15, further comprising:

a first fibre channel arbitrated loop drive operatively coupled to said first device slot; and wherein said first device slot, said second device slot, said third device slot, said fourth device slot, said fifth device slot, said sixth device slot, said seventh slot device, said eighth device slot, said ninth device slot, and said tenth device slot form a loop with said module connector.

18. A file server, comprising:

a computer; and a first device module operatively coupled to said computer via a first module connector, said first device module comprising:

a first module designator configured to set a first module identifier;

a first device slot configured to receive a first device, to operatively couple said first device to said first module connector, and to set a first address for said first device, said first address comprising an upper section set to said first module identifier and a lower section set to a first value;

a second device slot configured to receive a second device, to operatively couple said second device to said first module connector, and to set a second address for said second device, said second address comprising an upper section set to a second value and a lower section set to said first module identifier.

19. The file server of claim 18, further comprising:

a second device module operatively couple to said computer via a second module connector, said second device module comprising:

a second module designator configured to set a second module identifier that is different than said first module identifier;

a third device slot configured to receive a third device, to operatively couple said third device to said second module connector, and to set a third address for said third device, said third address comprising an upper section set to said second module identifier and a lower section set to a third value;

a fourth device slot configured to receive a fourth device, to operatively couple said fourth device to said second module connector, and to set a fourth address for said fourth device, said fourth address comprising an upper section set to a fourth value and a lower section set to said second module identifier.

20. The file server of claim 19, wherein:

said first device slot, said second device slot, said third device slot, and said fourth device slot are coupled in a loop configuration and are configured to receive a fibre channel arbitrated loop drive.

21. A method of setting a plurality of addresses, comprising the steps of:

setting a first module identifier for a first device module;

setting a first address for a first device, said first address comprising a first section and a second section;

setting a second address for a second device, said second address comprising a first section and a second section;

wherein the step of setting the first address for a first device includes the steps of setting the first section of the first address to the first module identifier, and setting the second section of the first address to a first value; and wherein the step of setting the second address for a second device includes the steps of setting the first section of the second address to a second value, and setting the second section of the second address to the first module identifier.

22. The method of claim 21, wherein:

a bit of the first section of the first address has a first significance to the first address and a bit of the first section of the second address has the same first significance to the second address, and a bit of the second section of the first address has a second significance to the first address and a bit of the second section of the second address has the same second significance to the second address.

\* \* \* \* \*